(12) United States Patent
Yamada et al.

(10) Patent No.: US 10,784,419 B2
(45) Date of Patent: Sep. 22, 2020

(54) LIGHT EMITTING DEVICE

(71) Applicant: NICHIA CORPORATION, Anan-shi, Tokushima (JP)

(72) Inventors: Motokazu Yamada, Tokushima (JP); Tomonori Ozaki, Anan (JP); Shinsaku Ikuta, Tokushima (JP); Yuichi Yamada, Anan (JP)

(73) Assignee: NICHIA CORPORATION, Anan-Shi (JP)

( * ) Notice: Subject to any disclaimer, the term of this patent is extended or adjusted under 35 U.S.C. 154(b) by 0 days.

(21) Appl. No.: 15/160,444

(22) Filed: May 20, 2016

(65) Prior Publication Data
US 2016/0343918 A1 Nov. 24, 2016

(30) Foreign Application Priority Data
May 21, 2015 (JP) .................. 2015-103386

(51) Int. Cl.
| H01L 33/54 | (2010.01) |
| H01L 33/58 | (2010.01) |
| H01L 33/56 | (2010.01) |
| H01L 33/50 | (2010.01) |
| H01L 33/52 | (2010.01) |

(52) U.S. Cl.
CPC .............. *H01L 33/54* (2013.01); *H01L 33/50* (2013.01); *H01L 33/501* (2013.01); *H01L 33/502* (2013.01); *H01L 33/504* (2013.01); *H01L 33/52* (2013.01); *H01L 33/56* (2013.01); *H01L 33/58* (2013.01); *H01L 2933/0091* (2013.01)

(58) Field of Classification Search
None
See application file for complete search history.

(56) References Cited

U.S. PATENT DOCUMENTS

| 2002/0080501 A1* | 6/2002 | Kawae | C09K 11/7774 359/799 |
| 2003/0227249 A1* | 12/2003 | Mueller | H01L 33/501 313/491 |
| 2009/0050911 A1 | 2/2009 | Chakraborty | |
| 2009/0135581 A1* | 5/2009 | Yano | H01L 33/44 362/84 |
| 2010/0244061 A1 | 9/2010 | Shirakawa et al. | |
| 2011/0127564 A1* | 6/2011 | Preuss | H01L 33/52 257/99 |
| 2012/0134137 A1* | 5/2012 | Lee | H01L 33/56 362/97.1 |
| 2012/0155061 A1 | 6/2012 | Manabe et al. | |

(Continued)

FOREIGN PATENT DOCUMENTS

| JP | 2006-324408 A | 11/2006 |
| JP | 2007-019459 A | 1/2007 |

(Continued)

*Primary Examiner* — Ermias T Woldegeorgis
(74) *Attorney, Agent, or Firm* — Foley & Lardner LLP

(57) ABSTRACT

A light emitting device includes a light emitting element; a sealing resin covering the light emitting element; and a light diffusing material contained in the sealing resin. When a difference in refractive index at 10° C. between the sealing resin and the light diffusing material is Δn1 and a difference in refractive index at 50° C. between the sealing resin and the light diffusing material is Δn2, a ratio of Δn2 to Δn1 is in a range of 95% to 105%.

11 Claims, 5 Drawing Sheets

(56) References Cited

U.S. PATENT DOCUMENTS

| | | |
|---|---|---|
| 2012/0274203 A1 | 11/2012 | Yokotani |
| 2013/0207148 A1* | 8/2013 | Krauter ............... H01L 33/50 257/98 |
| 2014/0021506 A1* | 1/2014 | Yamada ............... H01L 33/52 257/99 |
| 2014/0175478 A1 | 6/2014 | Wirth |
| 2014/0339585 A1 | 11/2014 | Liao et al. |
| 2015/0048391 A1 | 2/2015 | Sugimori et al. |
| 2015/0077966 A1 | 3/2015 | Bessho et al. |
| 2015/0102374 A1 | 4/2015 | Schmidtke et al. |
| 2015/0221836 A1 | 8/2015 | Kurino et al. |
| 2016/0254425 A1 | 9/2016 | Chung et al. |

FOREIGN PATENT DOCUMENTS

| | | |
|---|---|---|
| JP | 2007-266356 A | 10/2007 |
| JP | 2009-054995 A | 3/2009 |
| JP | 2009-152307 A | 7/2009 |
| JP | 2010-231938 A | 10/2010 |
| JP | 2012-129568 A | 7/2012 |
| JP | 2012-231036 A | 11/2012 |
| JP | 2013-529842 A | 7/2013 |
| JP | 2013-161967 A | 8/2013 |
| JP | 2013-211250 A | 10/2013 |
| JP | 2014-039006 A | 2/2014 |
| JP | 2014-041985 A | 3/2014 |
| JP | 2014-078691 A | 5/2014 |
| JP | 2014-229901 A | 12/2014 |
| JP | 2015-065293 A | 4/2015 |
| JP | 2015-073084 A | 4/2015 |
| JP | 2015-525465 A | 9/2015 |
| WO | WO-2011/142127 A1 | 11/2011 |
| WO | WO-2013/154133 A1 | 10/2013 |
| WO | WO-2014-034621 A | 3/2014 |
| WO | WO-2015-059258 A1 | 4/2015 |

* cited by examiner

LIGHT EMITTING DEVICE

CROSS-REFERENCE TO RELATED APPLICATIONS

The present application claims priority under 35 U.S.C. § 119 to Japanese Patent Application No. 2015-103386, filed May 21, 2015. The contents of this application are incorporated herein by reference in their entirety.

BACKGROUND

Technical Field

The present disclosure relates to a light emitting device.

Discussion of the Background

In recent years, as various electronic components have been proposed and put into practical use, higher performance is demanded of those electronic components. In particular, the electronic components are required to maintain their performance for a long period even when used in severe environments. Such demands also hold true for light emitting devices using a semiconductor light emitting element such as a light emitting diode (also referred to as an LED). That is, in the fields of general lighting and in- or on-vehicle lighting, a higher level of performance, a higher output (higher luminance) and higher reliability are demanded for light emitting devices each passing day. In particular, such a higher output necessitates operations at higher operating temperatures. Further, in the fields of backlight light sources and lighting devices, the light diffusion performance is also required. In order to improve the light diffusion performance of the light emitting device, a method of mixing a light diffusing material with a sealing resin is known.

For example, Japanese Unexamined Patent Application Publication No. 2007-266356 ("JP '356") discloses that disposing a light scattering member on the upper surface of a light emitting element reduces variations in the radiation intensity of light.

However, with a light emitting device disclosed in JP '356, in the case where a covering resin is formed on the light extracting surface side of the light emitting element, the light distribution characteristic may change due to a change in temperature. This is because the temperature coefficient of a refractive index of a general light diffusing member (e.g., oxides such as glass) is typically smaller than that of the covering resin by double digits. As a result, when high temperatures are obtained, the difference in the refractive index between the light diffusing member and that of the covering resin changes, whereby the light diffusion degree changes.

SUMMARY

A light emitting device according to one embodiment includes: a light emitting element; a sealing resin covering the light emitting element; and a light diffusing material contained in the sealing resin. When a difference in refractive index at 10° C. between the sealing resin and the light diffusing material is $\Delta n1$ and a difference in refractive index at 50° C. between the sealing resin and the light diffusing material is $\Delta n2$, a ratio of $\Delta n2$ to $\Delta n1$ is in a range of 95% to 105%. Further, other light emitting device according to the present embodiment includes: a light emitting element; a light-transmissive sealing resin covering the light emitting element; and a light diffusing material contained in the sealing resin. A temperature dependence coefficient of refractive index at 10° C. to 50° C. of the sealing resin and the light diffusing material is $-5 \times 10^{-5}/°$ C. to $-5 \times 10^{-4}/°$ C.

According to an embodiment of the present invention, a light emitting device with which a change in the light distribution characteristic attributed to a change in temperatures is reduced can be provided.

DETAILED DESCRIPTION OF EMBODIMENTS

Figure 1A:
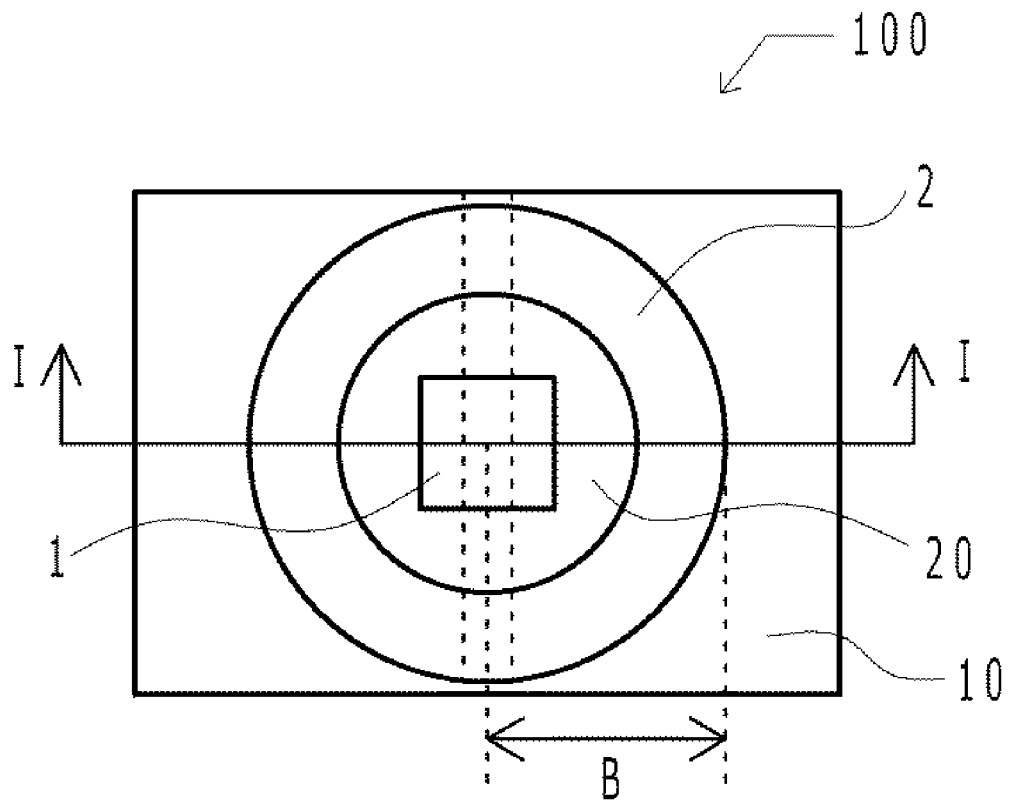
FIG. 1A is a top view showing a schematic structure of a light emitting device according to an embodiment.

In the following, a description will be given of embodiments of the present invention with reference to the drawings as appropriate. However, a light emitting device described in the following is to embody the technical idea, and not intended to limit the present invention thereto unless otherwise specified. Further, the content of the description of one embodiment or one example is applicable also to other embodiment or other example.

Further, in the following description, like names and reference numerals denote identical or like members, and a detailed description thereof will be omitted as appropriate. Still further, as to constituent elements of the present invention, an identical member may be made up of a plurality of elements such that one member serves as the plurality of elements. Conversely, the function of one member may be realized by being shared by a plurality of members.

First Embodiment

Figure 1B:
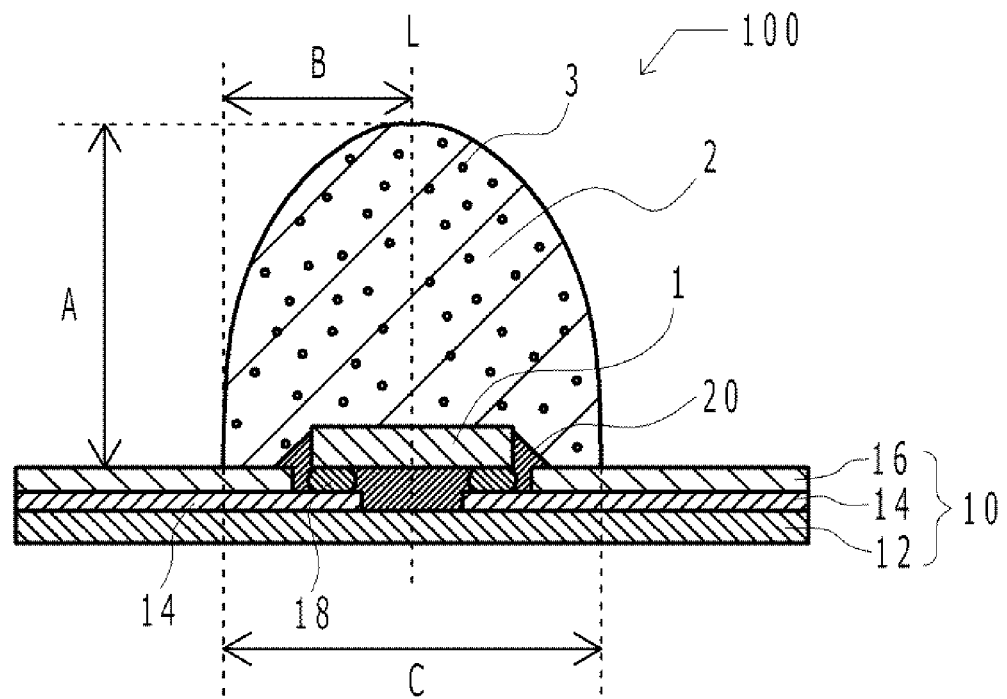
FIG. 1B is a cross-sectional view taken along line I-I of FIG. 1A.

FIG. 1A is a top view showing an exemplary light emitting device according to a first embodiment. FIG. 1B is a cross-sectional view taken along line I-I in FIG. 1A.

The light emitting device according to the present embodiment includes a light emitting element 1, a sealing resin 2 covering the light emitting element 1, and a light diffusing material 3 contained in the sealing resin 2. By allowing the light diffusing material 3 to be contained in the sealing resin 2, the light output from the light emitting element 1 can be diffused (scattered).

Here, by setting the temperature dependence coefficient of a refractive index of the sealing resin and a refractive index of the light diffusing material to substantially equivalent values, it becomes possible to reduce a change in the difference in the refractive index between the sealing resin and the light diffusing material attributed to a change in temperatures.

That is, even when the refractive index of the sealing resin is changed due to temperature, so long as the refractive index of the light diffusing material is set to be similarly changed, it becomes possible to reduce a change in the light distribution characteristic attributed to a change in temperatures.

Specifically, when the difference in the refractive index at 10° C. between the sealing resin and the light diffusing material is Δn1 and the difference in the refractive index at 50° C. between the sealing resin and the light diffusing material is Δn2, Δn1 and Δn2 are set such that the ratio of Δn2 to Δn1 is in a range of 95% to 105%. In this case, since the difference in the refractive index between the sealing resin and the light diffusing material within the operation temperature range of the light emitting device (e.g., −40° C. to 150° C.) becomes substantially constant, the influence on light distribution can be comparatively reduced. The refractive index is defined herein at 10° C. and 50° C. for the purpose of facilitating measurement of the refractive index. As will be described later, since the refractive index of resin reduces as the temperature rises, by setting the difference in the refractive index at 50° C., the difference in the refractive index in a temperature range higher than 50° C. can be estimated. By setting the difference in the refractive index at 10° C. and 50° C. to be in the above-described range, a change in light distribution attributed to a change in temperatures can be reduced even at temperatures lower than 10° C. or higher than 50° C.

Figure 2A:
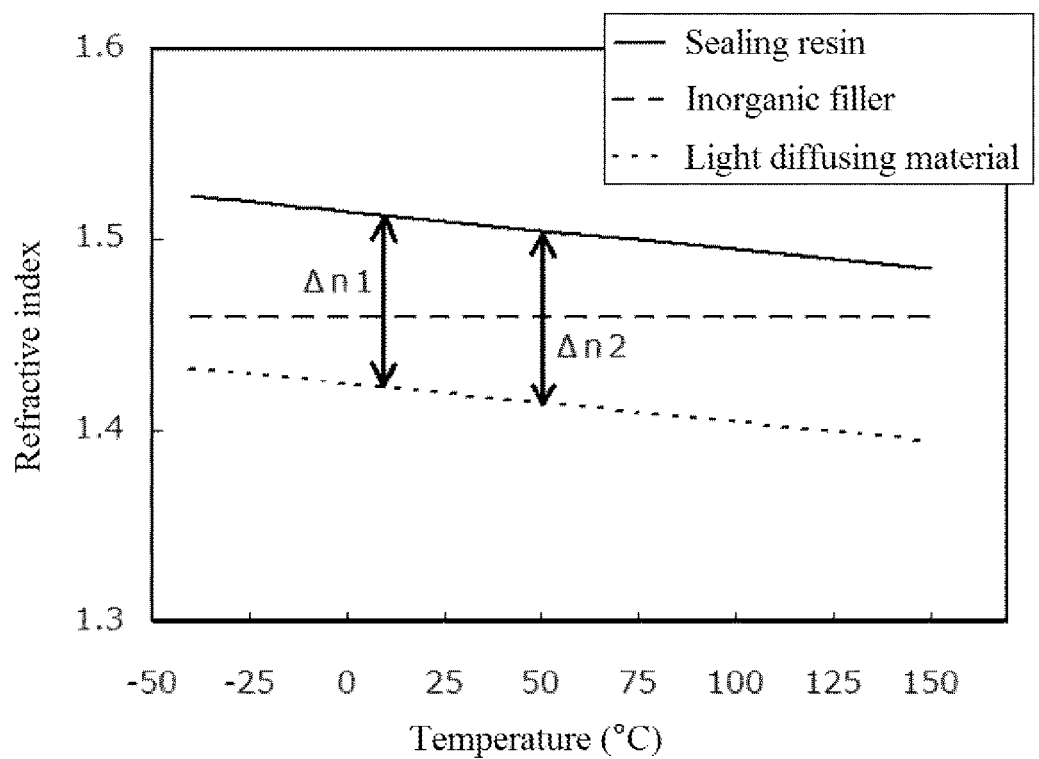
FIG. 2A is a conceptual diagram showing the refractive index of a sealing resin and that of a diffusing material according to a first embodiment.
Figure 2B:
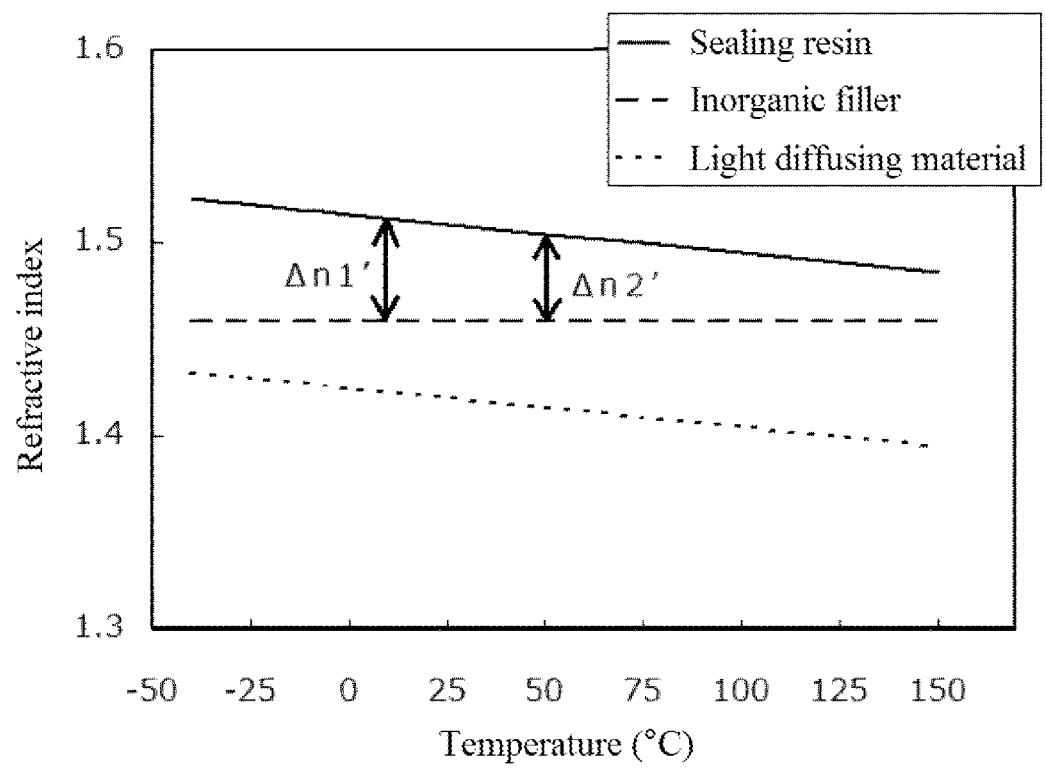
FIG. 2B is a conceptual diagram provided for comparison and showing the refractive index of the sealing resin and that of an inorganic filler.

FIG. 2A is a conceptual diagram showing changes in the refractive index of the sealing resin and that of the light diffusing material attributed to temperatures. For the purpose of comparison, the value of an inorganic filler, which is generally used as a light diffusing material, is also shown. Here, though a description will be given of the case where the refractive index of the sealing resin is higher than that of the light diffusing material, the refractive index of the light diffusing material may be higher than that of the sealing resin. FIG. 2B is a conceptual diagram showing changes in the refractive index of the sealing resin and that of the inorganic filler attributed to temperatures.

The changes in the refractive index of the inorganic filler attributed to temperatures are smaller than those of the organic filler. On the other hand, the refractive index of the sealing resin reduces as the temperature rises. Therefore, the difference in the refractive index between the sealing resin and the inorganic filler reduces as the temperature rises. With the sealing resin which is generally organic, changes in the refractive index attributed to temperatures (hereinafter also referred to as the "temperature dependence coefficient of refractive index") is $-1 \times 10^{-4}/°$ C. or greater. On the other hand, with an inorganic material, changes in the refractive index is about $-1 \times 10^{-6}/°$ C. Hence, with a combination thereof, the relative difference in the refractive index changes depending on the temperatures. Then, by a change in the light scattering characteristic, the light distribution characteristic changes.

That is, when the difference in the refractive index at 10° C. between the sealing resin and the organic filler (i.e., the light diffusing material) is Δn1 and that between the sealing resin and the inorganic filler is Δn1', and the difference in the refractive index at 50° C. between the sealing resin and the organic filler (i.e., the diffusing material) is Δn2 and that between the sealing resin and the inorganic filler is Δn2', as shown in FIG. 2A, there are little changes in the difference between Δn1 and Δn2. On the other hand, as shown in FIG. 2B, the difference between Δn1' and Δn2' is changed. Thus, the light distribution characteristic is different at 10° C. and at 50° C.

Hence, the ratio of Δn2 to Δn1 preferably is in a range of 95% to 105%, and more preferably in a range of 97% to 103%. Thus, a change in the light distribution characteristic attributed to a change in temperatures can be reduced.

Further, by setting the temperature dependence coefficient of refractive index at 10° C. to 50° C. of each of the sealing resin and the light diffusing material to be in a range of $-5 \times 10^{-5}/°$ C. to $-5 \times 10^{-4}/°$ C. also, the difference in the refractive index between the sealing resin and the light diffusing material in the operation temperature range of the light emitting device becomes substantially constant. Therefore, the influence on the light distribution can be reduced.

For the sake of convenience, the refractive index in the present specification refers to the value in general sodium D-lines (589.3 nm).

It is considered that, when the refractive index of the light diffusing material is lower than that of the sealing resin, the light extraction efficiency improves and hence it is preferable. When the refractive index of the light diffusing material is higher than that of the sealing resin, light once input to the light diffusing material repeats total internal reflection inside and is less likely to be extracted.

Figure 3:
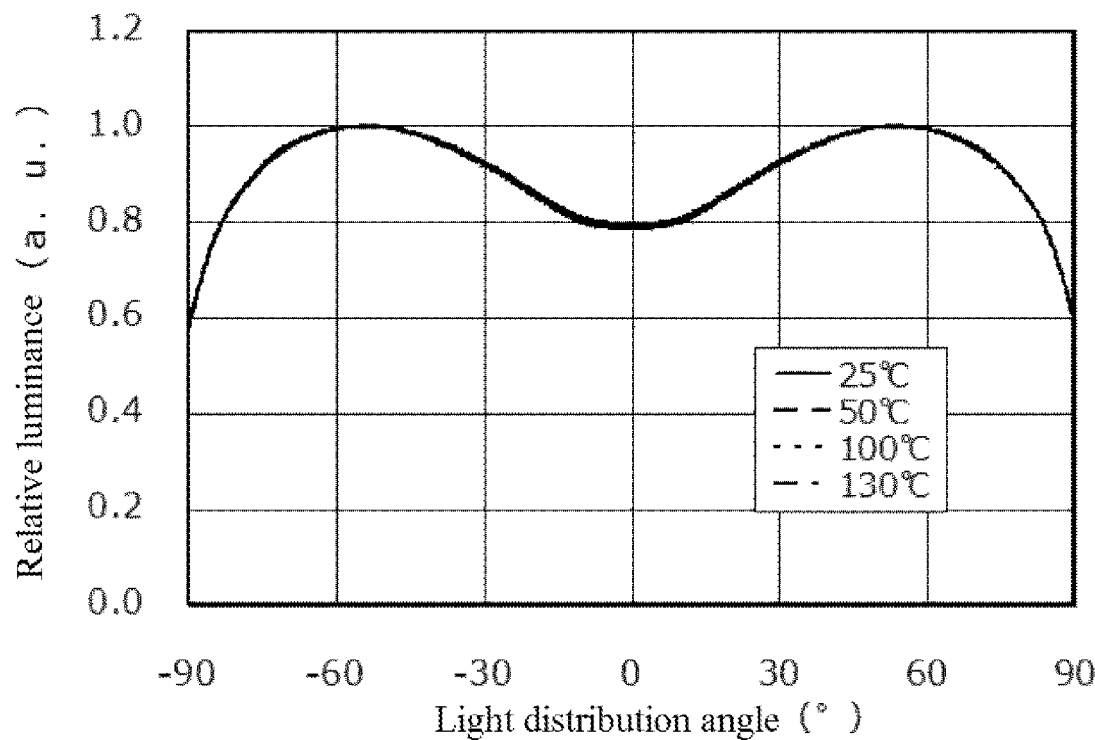
FIG. 3 is a diagram showing the light distribution characteristic of the light emitting device according to the first embodiment.

The shape of the sealing resin 2 can be changed as appropriate according to the desired light distribution characteristic. For example, as shown in FIG. 1B, when the sealing resin has a convex shape (e.g., an approximately semi-spheroidal shape or an approximately conical shape) in which height A in the optical axis (L) direction is longer than width C of the bottom surface of the sealing resin 2 in a cross-sectional view, so-called batwing light distribution is obtained. This is because light emitted by the light emitting element 1 is scattered by the light diffusing material 3, and the intensity of light emitted by the light emitting device becomes substantially proportional to the apparent area ratio of the sealing resin 2. As a result, the batwing-type light distribution characteristic as shown in FIG. 3 can be realized.

Figure 4:
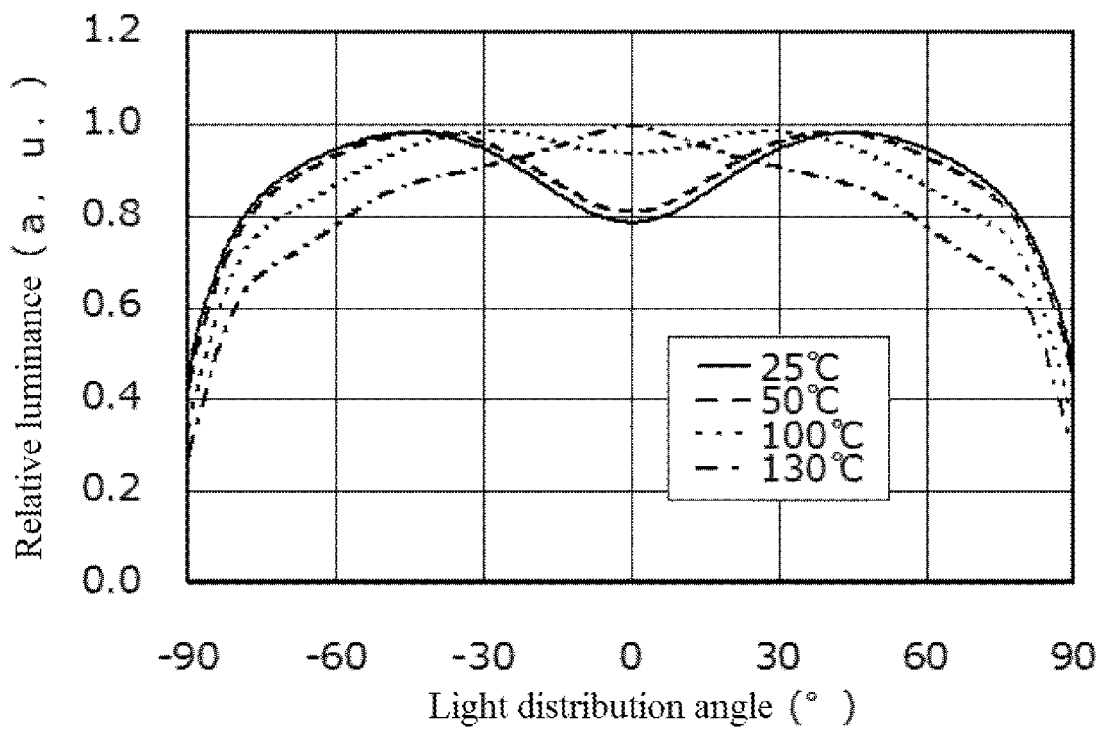
FIG. 4 is a diagram showing the light distribution characteristic of a light emitting device shown as a comparative example.

As described above, in the case where the light distribution characteristic is controlled by the light diffusing material 3 to obtain the desired shape, the light distribution characteristic may largely change depending on a change in temperatures. FIG. 4 shows the light distribution characteristic in the case where a $SiO_2$ filler being an inorganic filler is used as the light diffusing material with the light emitting device shown in FIG. 1. It can be seen that the light distribution characteristic of inorganic filler at 25° C. exhibits the intended light diffusion effect and shows the batwing-type light distribution, however at 130° C., the light distribution characteristic shows highest luminance in the 0° direction. This is because, as has been described with reference to the conceptual diagram of FIG. 2, the difference in the refractive index between the sealing resin and the light diffusing material reduces at high temperatures, resulting in a reduction in the light scattering characteristic.

In the present embodiment, as the light diffusing material, the material having a refractive index temperature coefficient substantially identical to that of the sealing resin is employed. Therefore, for example even at the temperatures of 25° C. to 130° C., the light distribution characteristic shows little changes as shown in FIG. 3, and the batwing light distribution can be maintained. Thus, the advantage of the present embodiment can be more significantly obtained.

The sealing resin may further include an inorganic nanofiller. The nanofiller may be added to adjust viscosity or the like. The nanofiller refers to those having a particle size of several nm to 100 nm. Preferably, silica nanofiller of several nm to 10 nm is employed. Since the nanofiller little influences the light scattering, the nanofiller is clearly distinguished from the above-described inorganic filler which influences the light distribution characteristic.

In the present specification, the term "particle size" refers to the average particle size, and the value is obtained by the air permeability method or the F.S.S.S. No. (Fisher Subsieve Sizer No.) (the value represented by a so-called D bar). The same holds true for the particle size of the light diffusing material and the particle size of a wavelength conversion substance which will be described later.

In the following, a description will be given of materials and the like suitable for the constituent elements of the light emitting device according to the embodiment.

(Light Emitting Element)

The light emitting element may be a semiconductor light emitting element such as a light emitting diode chip, for example. The semiconductor light emitting element may include a light-transmissive substrate, and a semiconductor stacked-layer body formed thereon. The light-transmissive substrate may be, for example, a light-transmissive insulating material such as sapphire ($Al_2O_3$) or spinel ($MgAl_2O_4$), or a semiconductor material that transmits light emitted from the semiconductor stacked-layer body (e.g., a nitride-based semiconductor material).

The semiconductor stacked-layer body includes, for example, a plurality of semiconductor layers such as an n-type semiconductor layer, a light emitting layer (i.e., an active layer), a p-type semiconductor layer and the like. The semiconductor layers may be formed by semiconductor materials such as Group III-V compound semiconductors, Group II-VI compound semiconductors or the like. Specifically, nitride-based semiconductor materials such as $In_X Al_Y Ga_{1-X-Y} N$ ($0 \leq X$, $0 \leq Y$, $X+Y \leq 1$) (e.g., InN, AlN, GaN, InGaN, AlGaN, InGaAlN) may be employed.

(Base Member)

The light emitting element is normally disposed on a base member having electrically conductive members. The disposition method may be flip-chip mounting in which the electrodes of the light emitting element are directly bonded to the electrically conductive members of the base member via a bonding member. Alternatively, the light emitting element may have its insulating substrate side bonded to the base member, and have its positive and negative electrodes at the upper surface connected by wires. The base member preferably has insulation property, for at least a pair of electrically conductive members to be disposed. The material of the base member may be, for example, resin such as phenol resin, epoxy resin, silicone resin, polyimide resin, BT resin, polyphthalamide (PPA), polyethylene terephthalate (PET) and ceramic. The ceramic may be, for example, alumina, mullite, forsterite, glass-ceramic, a nitride-based material (e.g., AlN), a carbide-based material (e.g., SiC) and the like.

Further, when resin is employed as the material structuring the base member, an improvement in the mechanical strength, a reduction in the thermal expansion coefficient, an improvement in the light reflectivity and the like can be achieved by mixing an inorganic filler such as glass fibers, $SiO_2$, $TiO_2$, $Al_2O_3$ or the like with the resin.

(Electrically Conductive Members)

The electrically conductive members are electrically connected to the electrodes of the light emitting element to supply current (power) from the outside. That is, the electrically conductive members serve as electrodes, or part of electrodes, for being externally energized. Normally, at least two positive and negative electrically conductive members are provided as being spaced apart from each other.

The electrically conductive members are formed at least at the upper surface of the base member where the light emitting element is placed. The material of the electrically conductive members can be selected as appropriate, depending on the material of the base member, the manufacturing method and the like.

For example, when ceramic is used as the material of the base member, the material of the electrically conductive members preferably has a high melting point for withstanding the firing temperature of a ceramic sheet. For example, use of metal having a high melting point such as tungsten, molybdenum and the like is preferable. Further, such high-melting-point metal may be covered by other metal material such as nickel, gold, silver or the like by plating, sputtering, vapor deposition or the like.

Further, when resin is used as the material of the base member, the material of the electrically conductive members preferably has good workability. Further, when resin obtained by injection molding is used, the material of the electrically conductive members preferably has good workability as to punching, etching, bending and the like, and preferably has relatively great mechanical strength. Specific examples include metal such as copper, aluminum, gold, silver, tungsten, iron, nickel and the like, and a metal layer or a lead frame of iron-nickel alloy, phosphor bronze, copper-iron alloy, molybdenum and the like. Further, the surface thereof may be further covered by a metal material. Though this material is not particularly limited, for example, solely silver, or alloys of silver and copper, silver and gold, silver and aluminum, silver and rhodium or the like may be used. Alternatively, a multilayer film using such silver and the alloys may be used. Further, the metal material may be disposed by sputtering, vapor deposition or the like, in place of plating.

(Sealing Resin)

The light-transmissive resin structuring the sealing resin may be thermosetting resin such as silicone resin, silicone-modified resin, epoxy resin, phenol resin and the like, or thermoplastic resin such as polycarbonate resin, acrylic resin, methylpentene resin, polynorbornene resin and the like. In particular, silicone resin exhibiting good light resistance and heat resistance is suitable. Among others, in order to improve the light extraction efficiency from the light emitting element 1, it is preferable to select phenyl-based silicone resin having a high refractive index.

(Light Diffusing Material)

The light diffusing material may be an organic filler. For example, it may be particles of any of various types of resin. In this case, the various types of resin may include, for example, silicone resin, polycarbonate resin, polyethersulfone resin, polyarylate resin, polytetrafluoroethylene resin, epoxy resin, cyanate resin, phenol resin, acrylic resin, polyimide resin, polystyrene resin, polypropylene resin, polyvinyl acetal resin, polymethyl methacrylate resin, urethane resin, polyester resin and the like.

The shape of the light diffusing material is not particularly limited, and any of various shapes may be employed. For example, the shape may be spherical, plate-like, rod-like, or layered. Alternatively, the light diffusing material may be indefinite in shape, such as a crushed object. Among them, from the viewpoint of low viscosity of the composite and good moldability, spherical shape is preferable.

Since the light diffusing material and the sealing resin are preferably substantially identical to each other in the temperature coefficient of refractive index, the material of the light diffusing material is preferably the same kind of that of the sealing resin. For example, when the sealing resin is silicone resin, it is preferable to employ silicone resin also as the light diffusing material. Thus, high light resistance is exhibited and the luminous flux substantially does not reduce that much.

In particular, it is preferable to employ methyl-based silicone resin as the light diffusing material and to employ phenyl-based silicone resin as the sealing resin. For the reason of employing phenyl-based silicone as the sealing resin, it can increase the refractive index, and consequently the light extraction efficiency from the light emitting element 1 improves.

For the reason of employing methyl-based silicone resin as the light diffusing material, it can reduce the refractive index than that of the sealing resin. The light once input to the filler can be extracted without causing total internal reflection in the filler, and the light emission efficiency is less likely to be reduced.

The particle size of the light diffusing material is greater than 0.1 μm, and not particularly limited so long as the size allows scattering of light from the light emitting element including light converted by the wavelength conversion substance which will be described later. For example, the particle size may be about 1 μm to 10 μm.

(Wavelength Conversion Substance)

The light emitting device may have a wavelength conversion substance. The wavelength conversion substance may be arranged, for example, densely on the light emitting element side in the sealing resin so as to surround the light emitting element, or may be dispersedly disposed in the sealing resin.

The wavelength conversion substance converts the wavelength of light emitted by the light emitting element into different wavelength. It goes without saying that a material capable of being excited by the light emission of the light emitting element is employed as the wavelength conversion substance. For example, fluorescent materials capable of being excited by a blue-color light emitting element or an ultraviolet light emitting element may include a cerium-activated yttrium-aluminum-garnet-based fluorescent material (Ce:YAG); a cerium-activated lutetium-aluminum-garnet-based fluorescent material (Ce:LAG); an europium and/or chromium-activated nitrogen-containing calcium aluminosilicate fluorescent material ($CaO—Al_2O_3—SiO_2$); an europium-activated silicate-based fluorescent material (($Sr,Ba)_2SiO_4$); a nitride-based fluorescent material such as a β-sialon fluorescent material, a CASN-based fluorescent material, a SCASN-based fluorescent material and the like; a KSF-based fluorescent material ($K_2SiF_6$.Mn); a sulfide-based fluorescent material, a quantum dot fluorescent material and the like. By combining these fluorescent materials and a blue-color light emitting element or an ultraviolet light emitting element, a light emitting device emitting light of various colors (e.g., a light emitting device emitting white light) can be manufactured.

The wavelength conversion substance absorbs light and nondirectionally outputs light of other wavelength. Therefore, the function thereof is different from that of the light diffusing material which diffuses light without converting the wavelength, and the wavelength conversion substance and the light diffusing material are clearly distinguished from each other. However, the light diffusing material in the present specification is not limited to the material that never absorbs light, and the material that does not substantially absorb light and convert wavelength will satisfy.

(Other Member)

The light emitting device may include other member as appropriate according to the intended use. For example, the light emitting device may include a protective element such as a Zener diode, or an underfill around the light emitting element. The light emitting device may include a connector or other electronic component.

(Mode of Light Emitting Device)

The light emitting device is applicable to any light emitting device such as an SMD (Surface Mount Device), a CSP (Chip Scale Package), a COB (Chip on Board), a COF (Chip on Flexible circuit board) and the like, so long as it includes the sealing resin. For example, the light emitting device may be the one having a cavity, and the cavity is filled with the sealing resin, alternatively, the one in which a light emitting element is mounted on a plate-like substrate, and on which the sealing resin is formed in a convex shape.

Second Embodiment

Figure 5A:
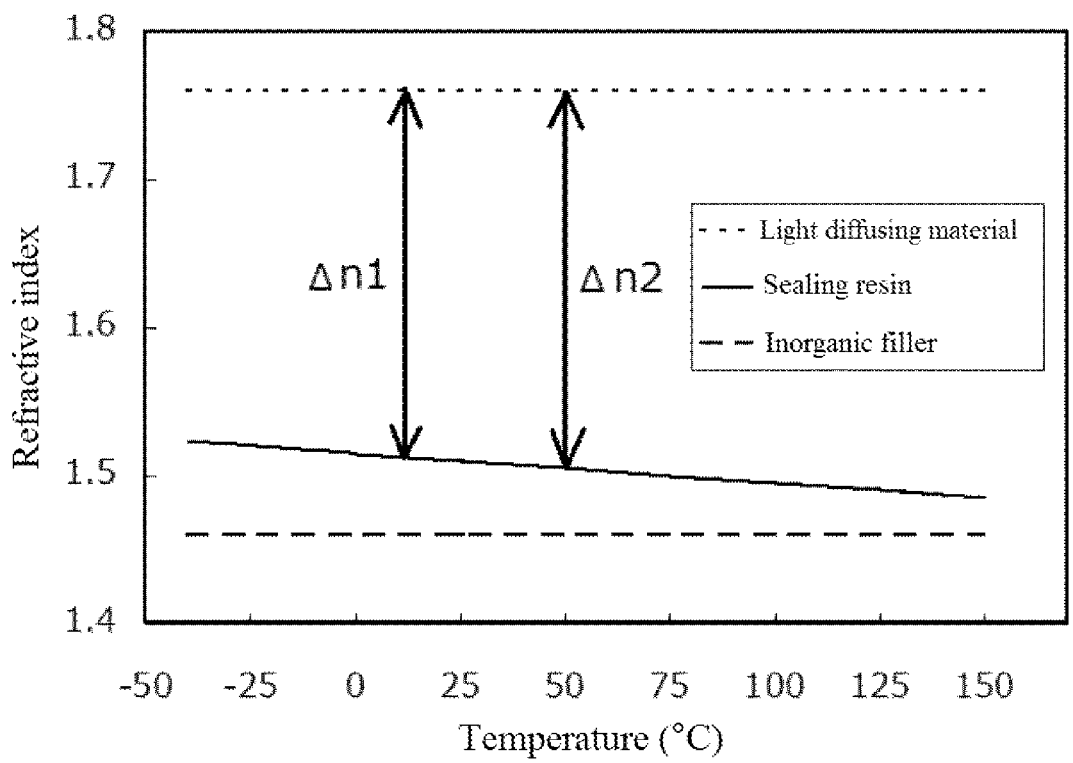
FIG. 5A is a conceptual diagram showing the refractive index of a sealing resin and that of a diffusing material according to a second embodiment.
Figure 5B:
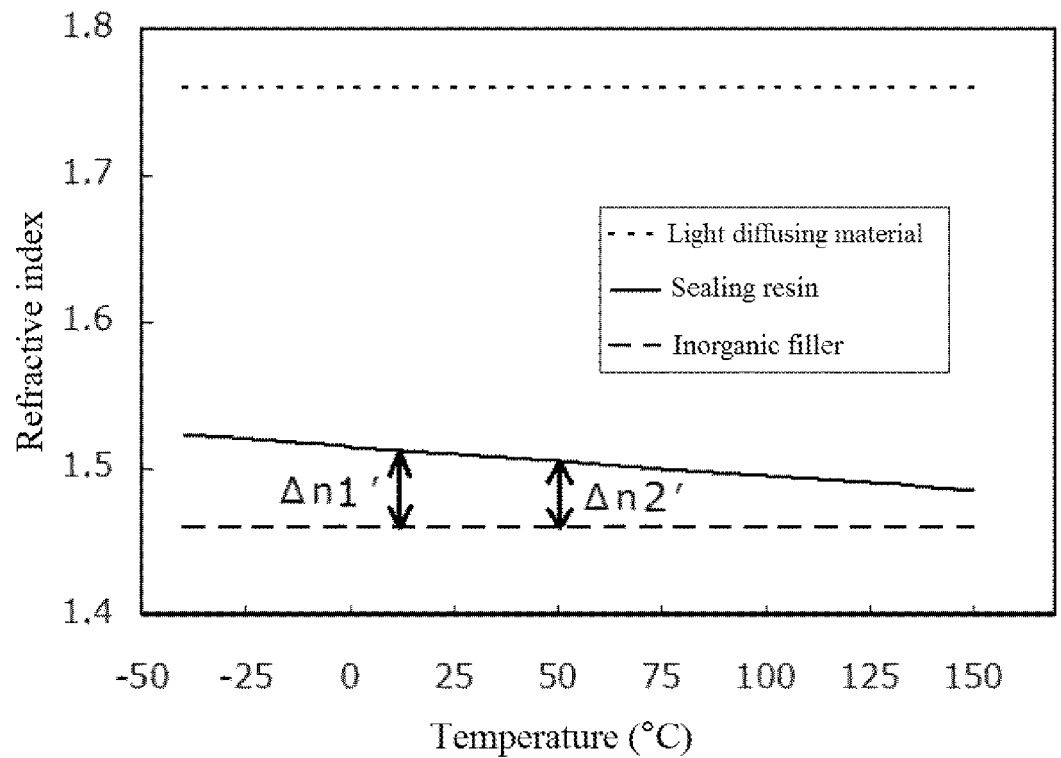
FIG. 5B is a conceptual diagram provided for comparison and showing the refractive index of the sealing resin and an inorganic filler.

In the second embodiment, a change in the light distribution characteristic attributed to temperatures is reduced by lessening the relative difference in the refractive index at 25° C. and 130° C. between the sealing resin 2 and the light diffusing material 3 though the absolute difference in the refractive index between the sealing resin 2 and the light diffusing material 3 is greater than that in the first embodiment. In the following, a description will be given with reference to FIGS. 5A and 5B.

Specifically, when the difference in the refractive index at 10° C. between the sealing resin and the light diffusing material is Δn1 and the difference in the refractive index at 50° C. between the sealing resin and the light diffusing material is Δn2, the difference between Δn1 and Δn2 is substantially equivalent to the difference between Δn1' and Δn2' being the difference in the refractive index between the sealing resin and the inorganic filler. However, since the original difference in the refractive index (Δn1) is great, the ratio of Δn2 to Δn1 becomes smaller than the ratio of Δn2' to Δn1'. A change in the light distribution characteristic attributed to a change in temperatures occurs by a change in the refractive index ratio. Accordingly, when the change in the refractive index ratio is small, a change in the light distribution characteristic becomes also small. Here, it is set such that the ratio of Δn2 to Δn1 falls within a range of 95% to 105%.

Thus, by adding a diffusing material being greater in the refractive index by a certain degree than the employed sealing resin also, the ratio of Δn2 to Δn1 can be set to be in the range of 95% to 105%. Thus, a change in the light distribution characteristic attributed to a change in temperatures can be reduced.

Since the materials same as those in the first embodiment can be employed in the second embodiment except for the light diffusing material, the description thereof is omitted. In the following, a description will be given of the light diffusing material that can be employed in the second embodiment.

(Light Diffusing Material)

The light diffusing material according to the present embodiment may be an inorganic filler. The inorganic filler is preferably higher than the employed sealing member in the refractive index, and Δn1 and Δn2 are preferably each 0.15 or more. For example, the light diffusing material may be alumina, zirconia, titania and the like.

EXAMPLES

Example 1

In the following, a specific description will be given based on Examples. However, the present invention is not limited to those Examples. In the present Example, a light emitting device 100 of a COF (Chip on Flexible circuit board) type as shown in FIG. 1 is provided. A substrate 10 includes glass epoxy having a thickness of 100 μm as a base member 12, and Cu having a thickness of 35 μm as electrically conductive members 14. A part of a surface of the electrically conductive members 14 is covered by a resist 16, while a part of the electrically conductive members 14 to be bonded to the light emitting element 1 with a bonding member 18 is exposed from the resist. The light emitting element 1 and the electrically conductive members 14 are bonded to each other using solder as the bonding member 18.

The light emitting element 1 is a nitride-based blue-color LED chip being square and having a side length of 600 μm in a plan view, and a thickness of 150 μm. As an underfill 20, silicone resin containing 30 wt % of titanium oxide is employed. The lower surface and the lateral surfaces of the light emitting element 1 are covered by the underfill 20.

As the material of the sealing resin, phenylmethyl silicone resin (having a refractive index at 25° C. of 1.51) is employed. As the material of the light diffusing material 3, dimethyl silicone resin (having a refractive index at 25° C. of 1.41) is contained by 10 wt %.

As shown in FIG. 1A, the outer shape of the sealing resin 2 is circular as seen from the top, and as shown in FIG. 1B, the cross-sectional shape of the sealing resin 2 is approximately semi-spheroidal shaped. Height A in the optical axis direction is 5.5 mm, and radius B of the bottom surface of the sealing resin 2 is 1.7 mm. The aspect ratio (A/B) is 3.2.

With such a structure, the light emitted by the light emitting element 1 is scattered by the dimethyl silicone resin being the light diffusing material. This causes the intensity of the light emitted by the light emitting device to be substantially proportional to the apparent area ratio of the sealing resin 2. As a result, the light distribution characteristic as shown in FIG. 3 can be realized. This light distribution indicates that the relative luminance around 50° to 60° is higher than the relative luminance around 0° at each point of 25° C., 50° C., 100° C., and 130° C. Thus, control for exhibiting the batwing light distribution is enabled. It can be seen that the light distribution characteristic little changes by temperatures. The ratio of Δn2 to Δn1 is 102%.

Example 2

Figure 6:
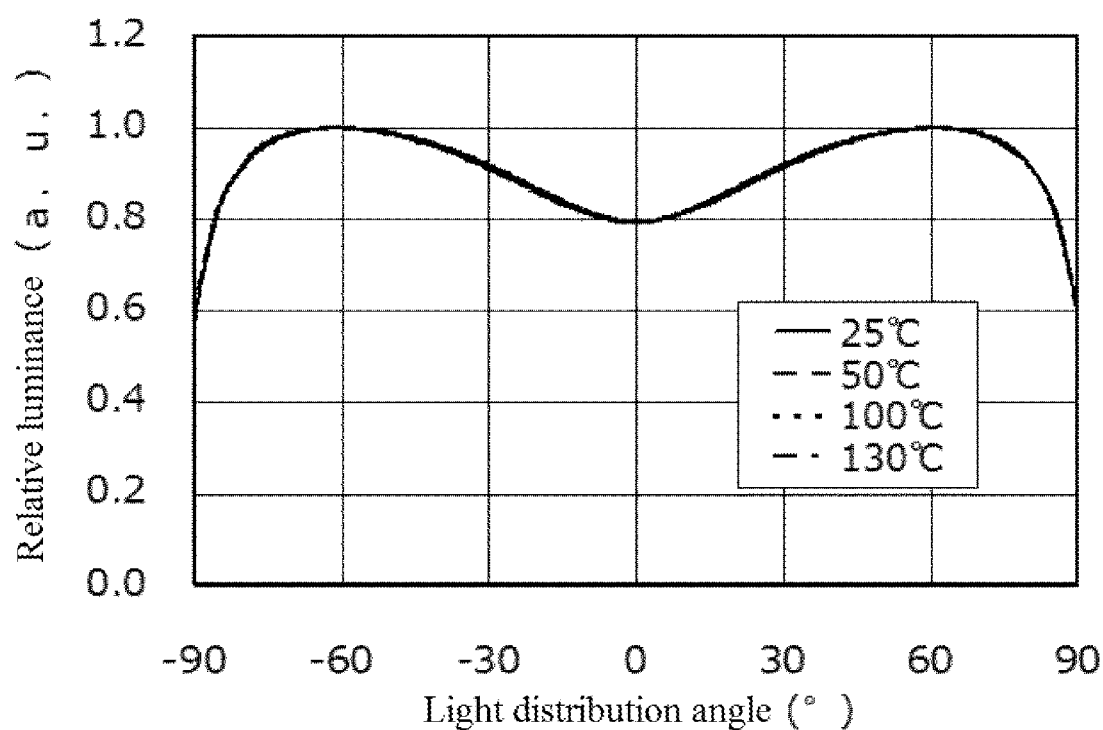
FIG. 6 is a diagram showing the light distribution characteristic of a light emitting device according to the second embodiment.

A light emitting device is provided similarly to Example 1 except that $Al_2O_3$ filler being an inorganic filler, which has a refractive index at 25° C. of 1.76, is contained by 5 wt % as the light diffusing material 3, in place of dimethyl silicone resin. FIG. 6 showing the light distribution characteristic indicates that the relative luminance around 50° to 60° is higher than the relative luminance around 0° at each point of 25° C., 50° C., 100° C., and 130° C. Thus, control for exhibiting the batwing light distribution is enabled. It can be seen that the light distribution characteristic little changes by temperatures. The ratio of Δn2 to Δn1 is 104%.

Comparative Example

As Comparative Example, a sample is provided similarly to Example 1 except that $SiO_2$ filler, which has a refractive index at 25° C. of 1.46, is contained by 30 wt % as the light diffusing material. FIG. 4 shows the light distribution characteristic of the sample at 25° C. and 130° C. Thus, it can be seen that, at high temperatures, the difference in the refractive index between the sealing resin 2 and the light diffusing material reduces, resulting in a reduction of the light scattering performance thereby increasing the luminance in the optical axis direction. That is, it can be seen that the light distribution characteristic changes depending on temperatures. The ratio of Δn2' to Δn1' is 82%.

The light emitting device of the present invention can be used for a backlight light source of a liquid crystal display, various illumination devices and the like.

What is claimed is:

1. A light emitting device comprising:
   a substrate;
   a light emitting element disposed on the substrate;
   a sealing resin covering the light emitting element, wherein a height of the sealing resin in an optical axis direction in a cross-sectional view of the sealing resin is larger than a maximum outer width of the sealing resin, and wherein the sealing resin has a first bottom surface that is in contact with an uppermost surface of the substrate, a second bottom surface that is in contact with an uppermost surface of the light emitting element, and a curved surface that curves upward and inward from an outer lateral periphery of the first bottom surface; and
   a light diffusing material contained in the sealing resin,
   wherein the sealing resin is formed of phenyl-based silicone resin, and a temperature dependence coefficient of a refractive index of the sealing resin at 10° C. to 50° C. is greater than $-5 \times 10^{-5}$/° C. and less than $-5 \times 10^{-4}$/° C.,
   wherein the light diffusing material is formed of methyl-based silicone resin, and a temperature dependence coefficient of the refractive index of the light diffusing material at 10° C. to 50° C. is greater than $-5 \times 10^{-5}$/° C. and less than $-5 \times 10^{-4}$/° C.,
   wherein the temperature dependence coefficient of the refractive index of the sealing resin is substantially equivalent to the temperature dependence coefficient of the refractive index of the light diffusing material, and
   wherein, when a difference in refractive index at 10° C. between the sealing resin and the light diffusing material is Δn1 and a difference in refractive index at 50° C. between the sealing resin and the light diffusing material is Δn2, a ratio of Δn2 to Δn1 is in a range of 95% to 105%.

2. The light emitting device according to claim 1, wherein the light diffusing material is an organic filler.

3. The light emitting device according to claim 1, wherein a refractive index of the light diffusing material is lower than a refractive index of the sealing resin.

4. The light emitting device according to claim 1, wherein the light diffusing material is an inorganic filler.

5. The light emitting device according to claim 1, wherein the sealing resin contains an inorganic nanofiller.

6. The light emitting device according to claim 1, further comprising a wavelength conversion substance converting wavelength of light emitted by the light emitting element into different wavelength.

7. The light emitting device according to claim 1, wherein the outer lateral periphery of the first bottom surface is an outermost lateral periphery of the sealing resin.

8. The light emitting device according to claim 1, wherein the sealing resin has an approximately semi-spheroidal cross-sectional shape when viewed in a lateral direction.

9. The light emitting device according to claim 1, wherein an entirety of the curved surface of the sealing resin is exposed from the substrate.

10. The light emitting device according to claim 1, wherein the sealing resin is formed as a single continuous piece of material.

11. The light emitting device according to claim 1,
wherein the substrate comprises a base member, a plurality of electrically conductive members disposed on the base member, and a resist covering a part of the plurality of electrically conductive members, and
wherein the first bottom surface of the sealing resin is in contact with an upper surface of the resist.

\* \* \* \* \*